US012757691B2

(12) United States Patent
Guo et al.

(10) Patent No.: US 12,757,691 B2
(45) Date of Patent: Oct. 6, 2026

(54) SEMICONDUCTOR STRUCTURE AND FABRICATION METHOD THEREOF

(71) Applicant: UNITED MICROELECTRONICS CORP., Hsin-Chu City (TW)

(72) Inventors: Xiao Guo, Singapore (SG); Xingxing Chen, Singapore (SG); Ching-Yang Wen, Singapore (SG); Purakh Raj Verma, Singapore (SG)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 361 days.

(21) Appl. No.: 18/406,225

(22) Filed: Jan. 8, 2024

(65) Prior Publication Data

US 2025/0183096 A1 Jun. 5, 2025

(30) Foreign Application Priority Data

Dec. 4, 2023 (TW) ................................ 112147062

(51) Int. Cl.

| | |
|---|---|
| ***H10P 90/00*** | (2026.01) |
| ***H10D 86/00*** | (2025.01) |
| ***H10D 86/01*** | (2026.01) |
| ***H10W 10/00*** | (2026.01) |
| ***H10W 10/10*** | (2026.01) |
| ***H10W 10/17*** | (2026.01) |

(52) U.S. Cl.
CPC ......... *H10P 90/1906* (2026.01); *H10D 86/01* (2025.01); *H10D 86/201* (2025.01); *H10W 10/014* (2026.01); *H10W 10/061* (2026.01); *H10W 10/17* (2026.01); *H10W 10/181* (2026.01)

(58) Field of Classification Search
CPC ... H10W 10/014–0148; H10W 10/061; H10W 10/17
See application file for complete search history.

(56) References Cited

U.S. PATENT DOCUMENTS

| | | | | |
|---|---|---|---|---|
| 6,468,880 | B1 | 10/2002 | Lim | |
| 7,037,755 | B2 | 5/2006 | Enquist | |
| 2007/0246756 | A1 | 10/2007 | Mouli | |
| 2010/0055892 | A1 * | 3/2010 | Poelzl | H10D 30/668 257/E21.294 |

* cited by examiner

*Primary Examiner* — Daniel P Shook
(74) *Attorney, Agent, or Firm* — Winston Hsu

(57) ABSTRACT

A method for forming a semiconductor structure is disclosed. A substrate having a front surface and a rear surface is provided. A plurality of trenches extending into the substrate from the front surface of the substrate is formed. A polishing stop structure is formed at a bottom of each of the plurality of trenches. The plurality of trenches is filled with a gap-filling material layer. The rear surface of the substrate is subjected to a polishing process to remove a portion of the substrate from the rear surface until the polishing stop structure is exposed.

9 Claims, 7 Drawing Sheets

SEMICONDUCTOR STRUCTURE AND FABRICATION METHOD THEREOF

BACKGROUND OF THE INVENTION

1. Field of the Invention

The present invention relates to the field of semiconductor technology, and in particular, to an improved semiconductor structure and a manufacturing method thereof.

2. Description of the Prior Art

Typically, to form semiconductor silicon-on-insulator (SOI) devices, a SOI substrate is used as the starting material. Circuit components are made on the epitaxial silicon layer of the SOI substrate and are bonded to a handler wafer, and then a wafer backside grinding process is performed to thin the silicon base layer of the SOI substrate. In the above wafer backside grinding process, the buried oxide layer of the SOI substrate is used as the grinding stop layer. However, the SOI substrates are expensive. This technical field still needs an improved semiconductor structure and manufacturing method to reduce manufacturing costs.

SUMMARY OF THE INVENTION

It is one object of the present invention to provide an improved semiconductor structure and manufacturing method in order to overcome the deficiencies or shortcomings of the existing technology.

One aspect of the invention provides a method for forming a semiconductor structure. A substrate having a front surface and a rear surface is provided. A plurality of trenches extends into the substrate from the front surface of the substrate. A polishing stop structure is formed at a bottom of each of the plurality of trenches. The plurality of trenches is filled with a gap-filling material layer. The rear surface of the substrate is subjected to a polishing process to remove a portion of the substrate from the rear surface until the polishing stop structure is exposed.

According to some embodiments, the polishing stop structure has a U shaped sectional profile.

According to some embodiments, the polishing stop structure comprises a silicon nitride layer.

According to some embodiments, the polishing stop structure comprises a carbon doped silicon nitride layer.

According to some embodiments, the polishing process comprises a chemical mechanical polishing process.

According to some embodiments, before subjecting the rear surface of the substrate to the polishing process, the method further comprises the steps of forming circuit elements in active areas on the front surface of the substrate; and forming a first interconnect structure on the front surface of the substrate.

According to some embodiments, the active areas are electrically isolated from one another by the gap-filling material layer.

According to some embodiments, after subjecting the rear surface of the substrate to the polishing process, the polishing stop structure is removed, thereby forming U-shaped recesses on the rear surface of the substrate.

According to some embodiments, the method further comprises the step of filling U-shaped recesses with an insulating layer.

According to some embodiments, the method further comprises the step of forming a second interconnect structure on the insulating layer.

Another aspect of the invention provides a semiconductor structure including a substrate having a front surface and a rear surface; a plurality of trenches extending into the substrate from the front surface of the substrate and penetrating through the substrate; a gap-filling material layer partially filling into the plurality of trenches from the front surface of the substrate, thereby forming U-shaped recesses on the rear surface of the substrate; and an insulating layer filling into the U-shaped recesses on the rear surface of the substrate.

According to some embodiments, the semiconductor structure further comprises circuit elements in active areas on the front surface of the substrate; and a first interconnect structure on the front surface of the substrate.

According to some embodiments, the active areas are electrically isolated from one another by the gap-filling material layer and the insulating layer.

According to some embodiments, the semiconductor structure further comprises a second interconnect structure on the insulating layer.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
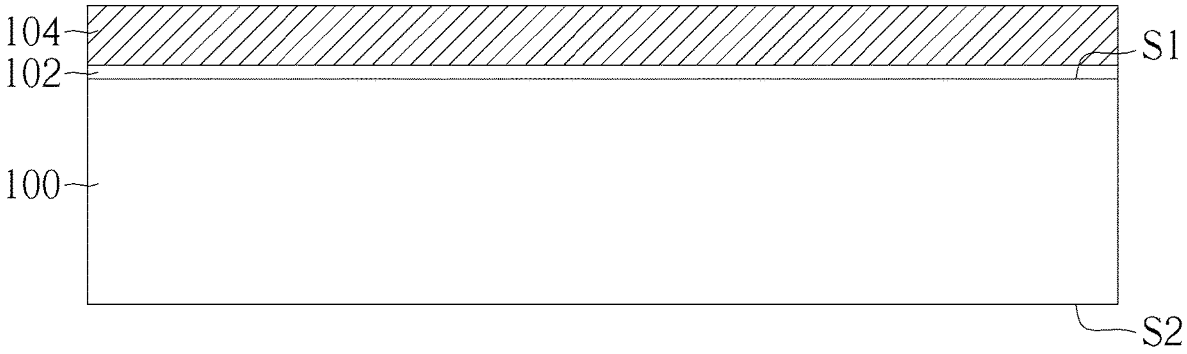
FIG. 1 to FIG. 13 are schematic diagrams showing a method of manufacturing a semiconductor structure according to an embodiment of the present invention.

Please refer to FIG. 1 to FIG. 13, which are schematic diagrams showing a method of manufacturing a semiconductor structure according to an embodiment of the present invention. First, as shown in FIG. 1, a substrate 100 is provided. The substrate 100 has a front surface S1 and a rear surface S2. According to an embodiment of the present invention, the substrate 100 may include a silicon substrate, but is not limited thereto. According to an embodiment of the present invention, for example, the substrate 100 may include a P-type silicon substrate comprising a P-epitaxial silicon layer on a P+ silicon base layer or an N-type silicon substrate comprising an N-epitaxial silicon layer on an N+ silicon base layer. Next, a silicon oxide liner layer 102 and a silicon nitride pad layer 104 are formed on the front surface S1 of the substrate 100.

Figure 2:
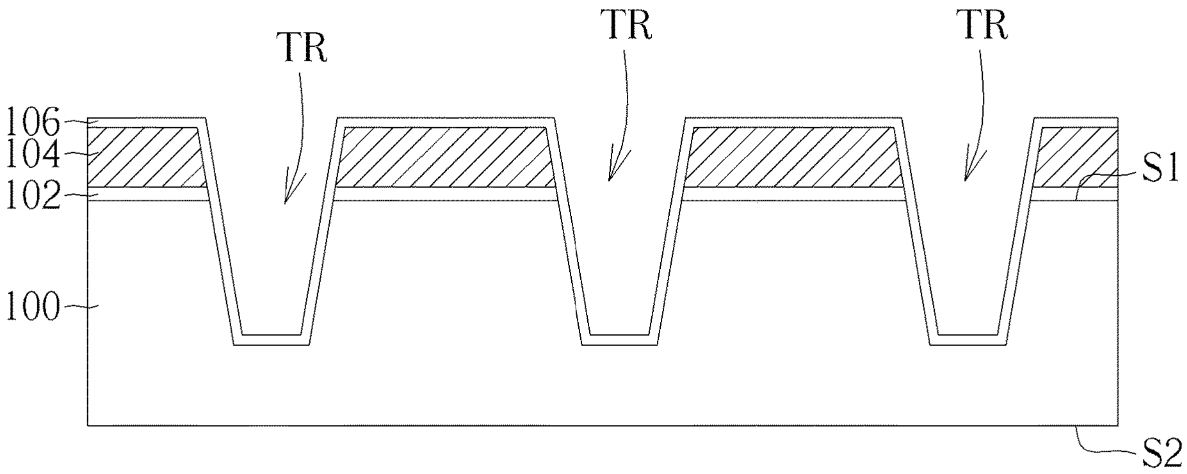

As shown in FIG. 2, a photolithography process and an etching process are performed to form a plurality of trenches TR in the front surface S1 of the substrate 100. The plurality of trenches TR penetrate through the silicon oxide liner layer 102 and the silicon nitride pad layer 104 and extend into the substrate 100 to a predetermined depth. The predetermined depth is deeper than the depth of the shallow trench isolation region of the standard CMOS processes. Next, a thermal oxidation method or a deposition method is used to form a silicon oxide liner layer 106 on the surfaces of the plurality of trenches TR and the silicon nitride pad layer 104.

Figure 3:
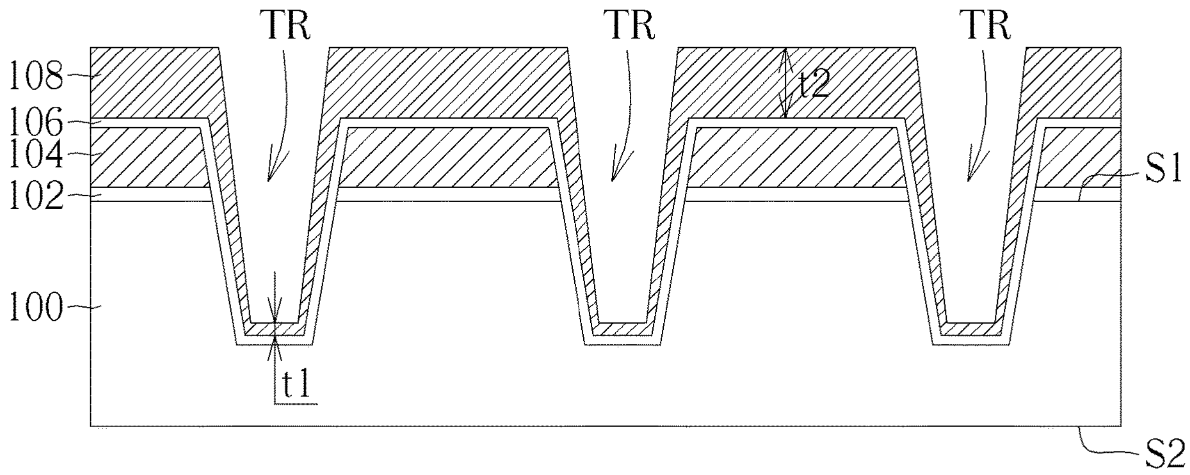

As shown in FIG. 3, a chemical vapor deposition (CVD) process is then performed to deposit a silicon nitride layer 108 on the entire substrate 100 in a blanket manner. According to an embodiment of the present invention, the silicon nitride layer 108 does not completely fill the plurality of trenches TR. According to an embodiment of the present invention, the silicon nitride layer 108 is deposited conformally on the silicon oxide liner 106. According to an embodiment of the present invention, the thickness of the silicon nitride layer 108 may range between 500-1200 angstroms. According to an embodiment of the present invention, the thickness d1 of the silicon nitride layer 108 at the bottom of the plurality of trenches TR may be smaller than the thickness d2 of the silicon nitride layer 108 on the top surface of the silicon nitride pad layer 104.

Figure 4:
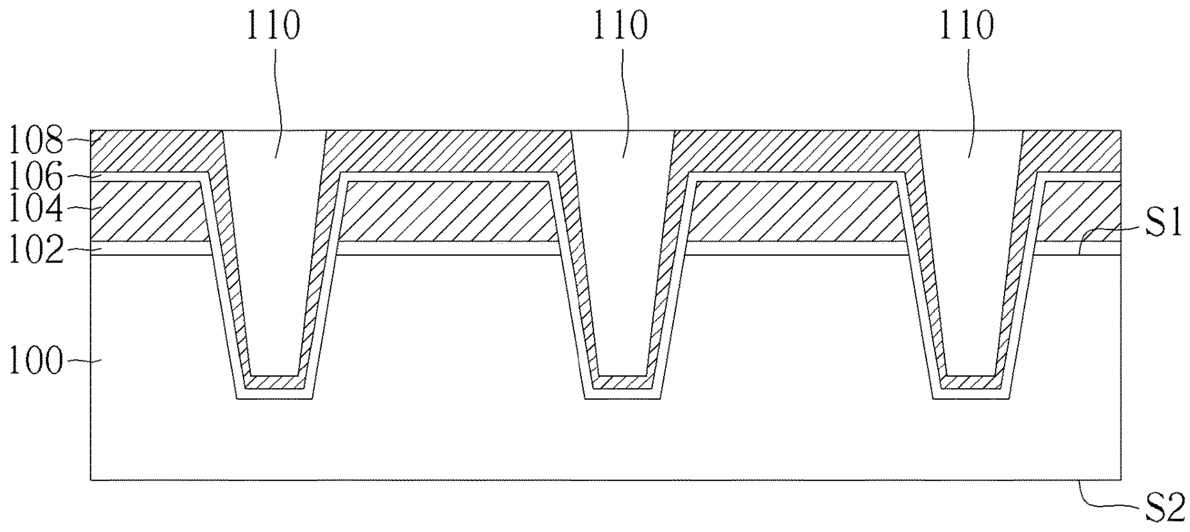

As shown in FIG. 4, a chemical vapor deposition process, such as a plasma-enhanced chemical vapor deposition (PECVD) process, is then performed to deposit a silicon oxide layer 110 on the substrate 100 in a blanket manner. According to an embodiment of the present invention, the silicon oxide layer 110 fills the plurality of trenches TR. Next, a chemical mechanical polishing (CMP) process is performed to remove the silicon oxide layer 110 outside the plurality of trenches TR, leaving only the silicon oxide layer 110 within the plurality of trenches TR. At this point, the top surface of the silicon oxide layer 110 is coplanar with the top surface of the silicon nitride layer 108.

Figure 5:
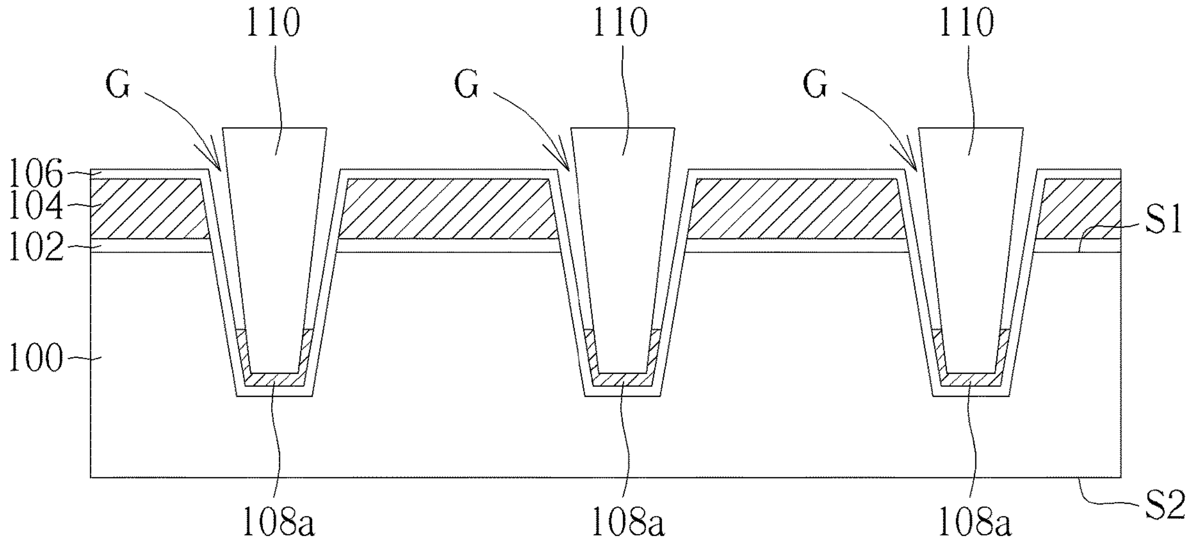

As shown in FIG. 5, an etching process, such as a wet etching process, is then performed to remove part of the silicon nitride layer 108, leaving only the silicon nitride layer 108 at the bottom of the plurality of trenches TR, thereby forming a polishing stop structure **108*a* having a U-shaped sectional profile. According to an embodiment of the present invention, the polishing stop structure 108*a* includes a silicon nitride layer. According to other embodiments of the present invention, polishing stop structure 108*a* includes a carbon-doped silicon nitride layer. At this point, after part of the silicon nitride layer 108** is removed, gaps G are formed in the plurality of trenches TR.

Figure 6:
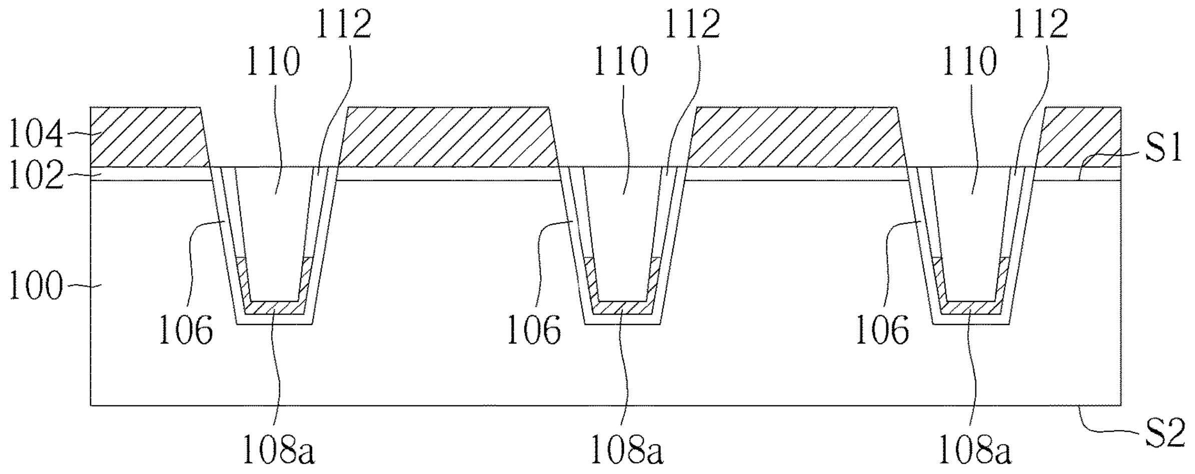

As shown in FIG. 6, a deposition process is then performed to fill the gaps G in the plurality of trenches TR with a gap-filling material layer 112, for example, a silicon oxide layer. Then, a chemical mechanical polishing process is performed to remove the gap-filling material layer 112 and the silicon oxide liner layer 106 on the silicon nitride pad layer 104. Next, the silicon oxide layer 110 and the gap-filling material layer 112 in the plurality of trenches TR are partially removed by wet etching. At this point, the top surfaces of the silicon oxide layer 110 and the gap-filling material layer 112 are lower than the top surface of the silicon oxide liner layer 106.

Figure 7:
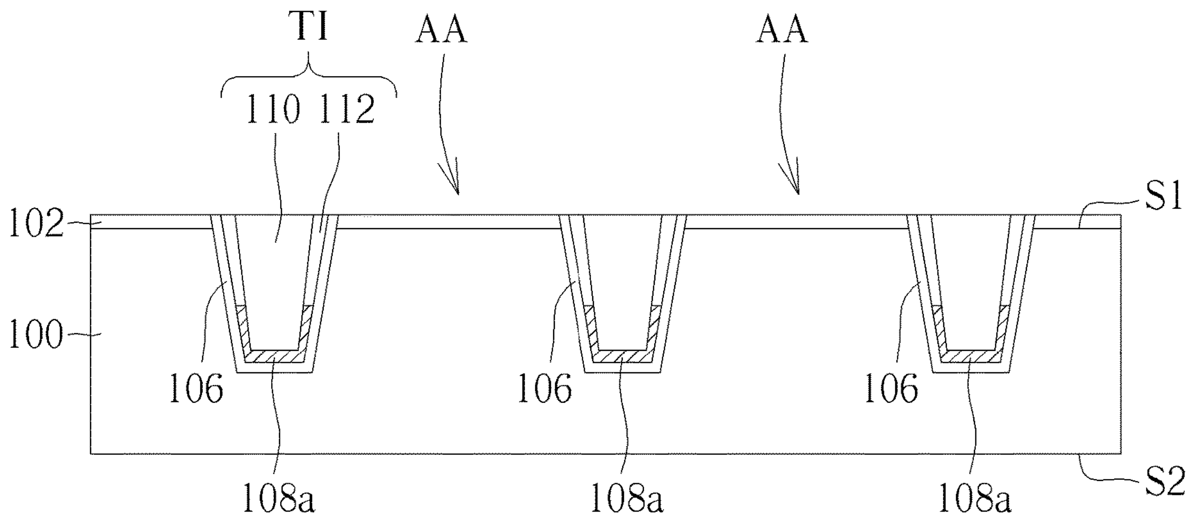

As shown in FIG. 7, an etching process, such as a wet etching process, is then performed to remove the silicon nitride pad layer 104, thereby exposing the silicon oxide liner layer 102. At this point, the top surfaces of the silicon oxide layer 110 and the gap-filling material layer 112 may be slightly higher than the top surface of the silicon oxide liner layer 102. The silicon oxide layer 110 and the gap-filling material layer 112 constitute a trench isolation structure TI, which defines a plurality of active areas AA that are electrically isolated from one other on the front surface S1 of the substrate 100.

Figure 8:
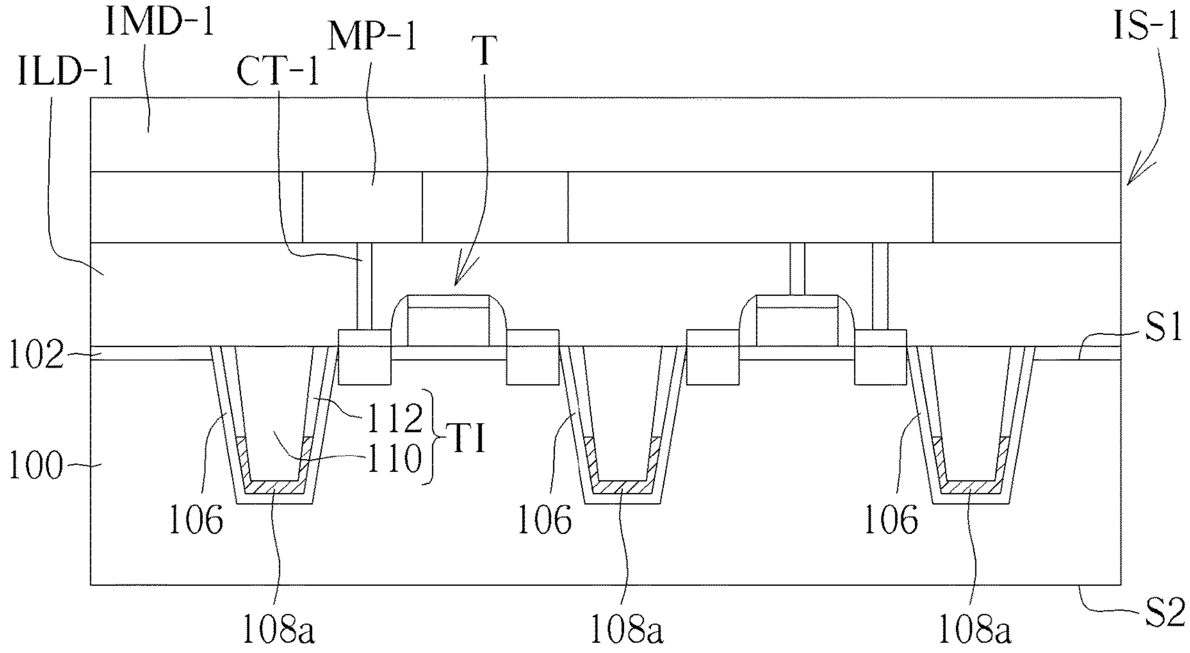

As shown in FIG. 8, next, a circuit element T, such as a transistor, but not limited to this, is formed in the active area AA on the front surface S1 of the substrate 100. Then, the first interconnect structure IS-1 is formed on the front surface S1 of the substrate 100. According to an embodiment of the present invention, for example, the first interconnect structure IS-1 may include an interlayer dielectric layer ILD-1, a contact plug CT-1 formed in the interlayer dielectric layer ILD-1, an inter-metal dielectric layer IMD-1 on the interlayer dielectric layer ILD-1, and a metal circuit layer MP-1 formed in the inter-metal dielectric layer IMD-1.

Figure 9:
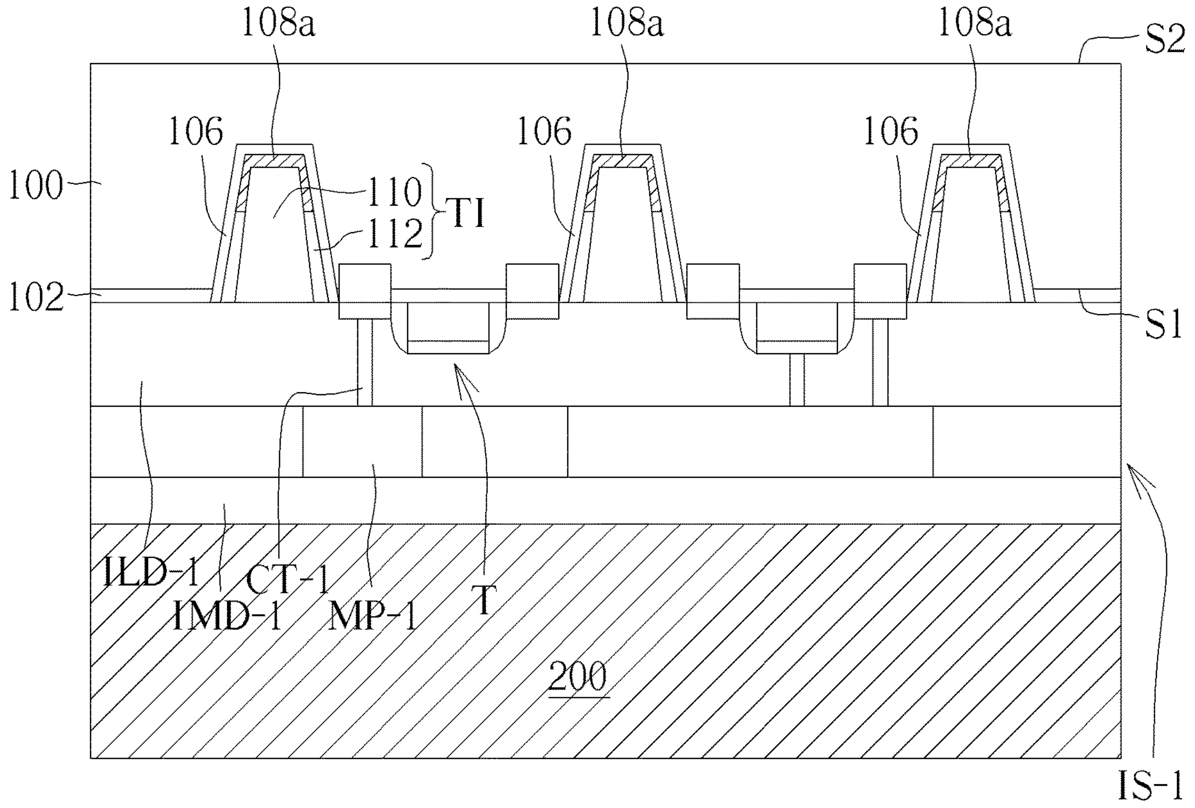

As shown in FIG. 9, the substrate 100 is then flipped and the first interconnect structure IS-1 on the front surface S1 of the substrate 100 is bonded to a handler wafer 200. For example, the handler wafer 200 may include a high-resistance silicon wafer, glass or dielectric material.

Figure 10:
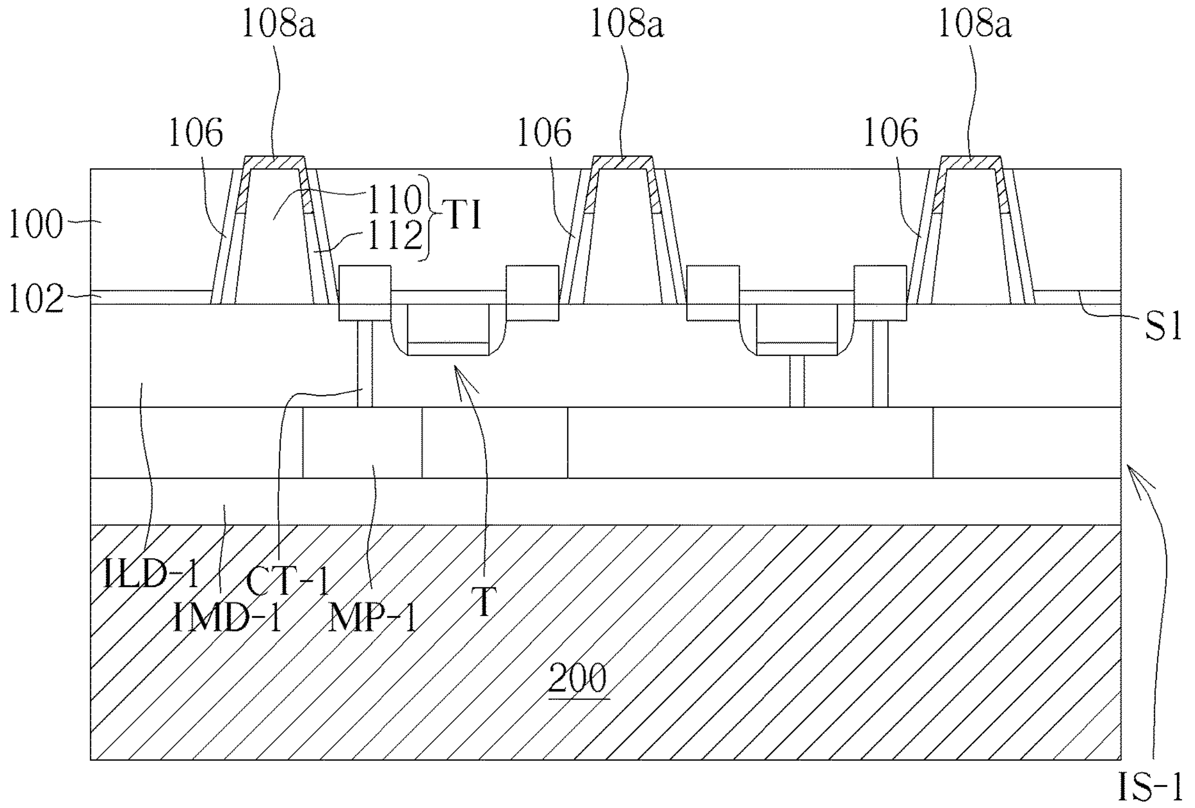

As shown in FIG. 10, a wafer backside grinding process is performed on the rear surface S2 of the substrate 100 to remove part of the substrate 100 from the rear surface S2 until the polishing stop structure **108*a*** is exposed. According to an embodiment of the present invention, the above-mentioned wafer backside grinding process includes a chemical mechanical polishing process.

Figure 11:
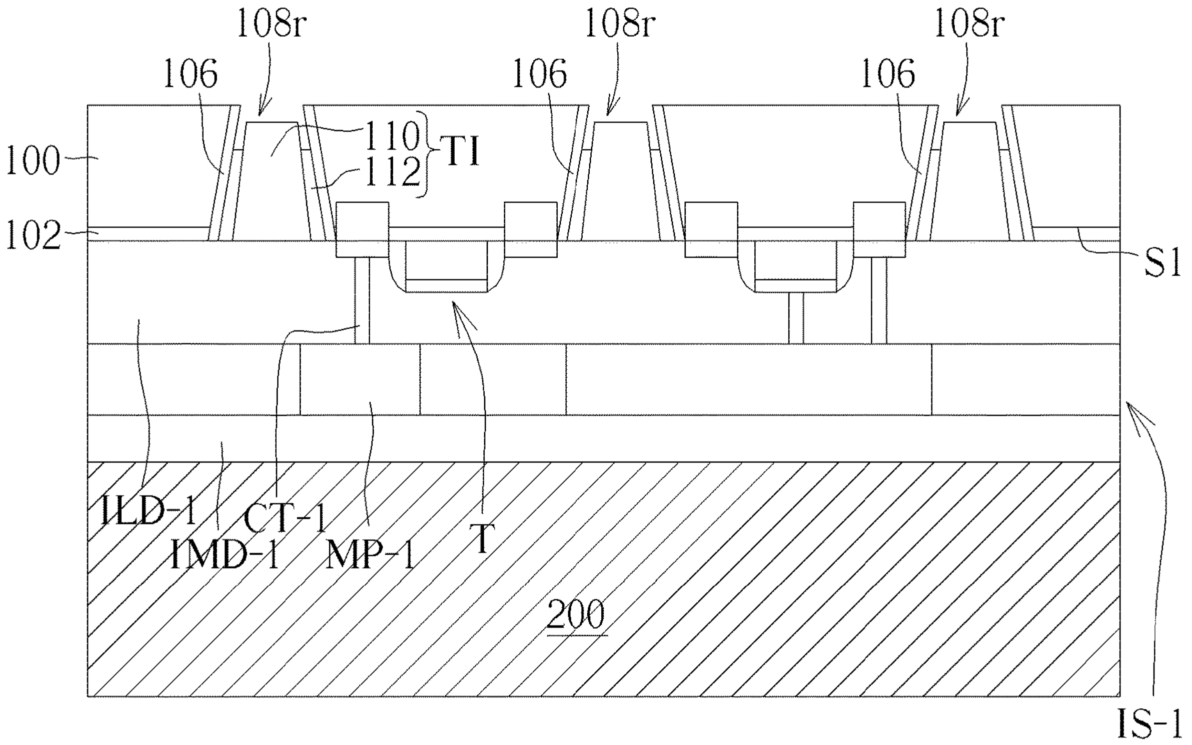

As shown in FIG. 11, after the polishing process is performed on the rear surface S2 of the substrate 100, the polishing stop structure **108*a* can be removed using a wet etching process, thereby forming a U-shaped recess 108*r* on the rear surface S2 of the substrate 100**.

Figure 12:
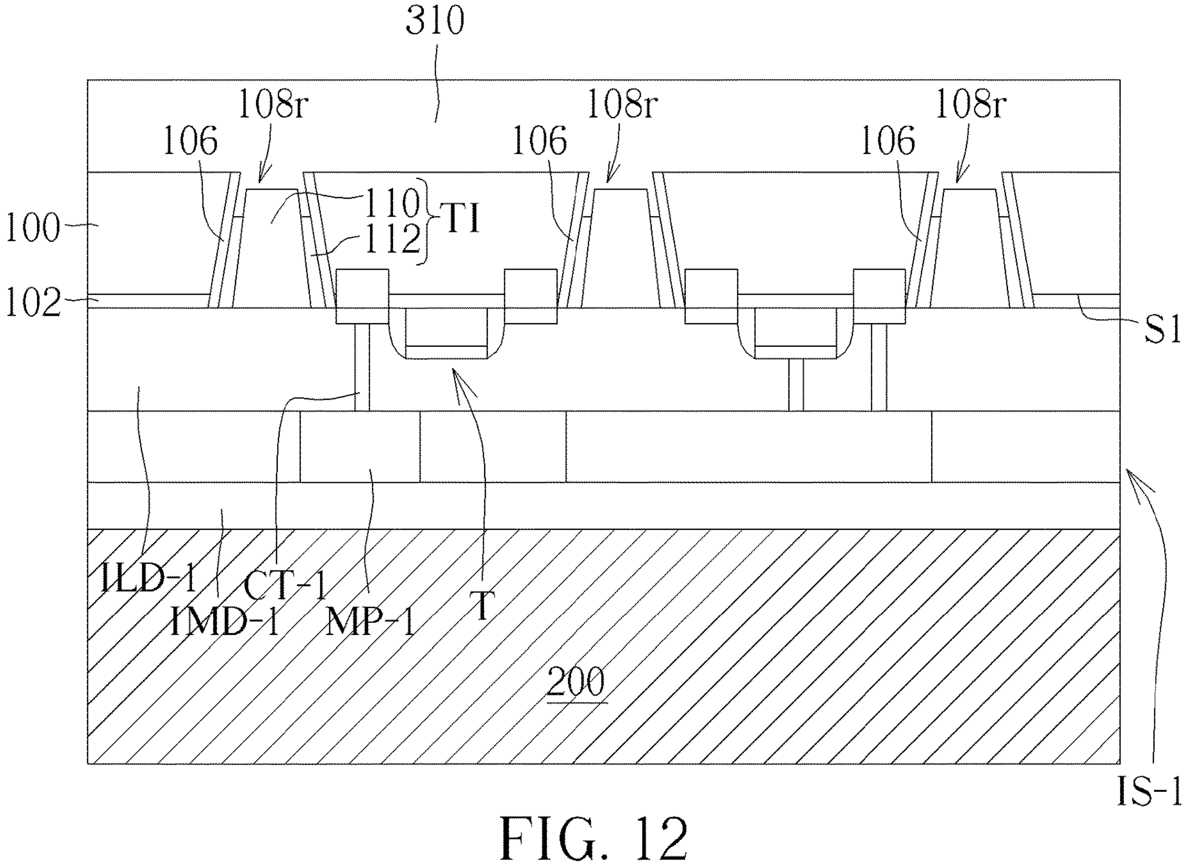

As shown in FIG. 12, a chemical vapor deposition process is then performed to deposit an insulating layer 310 on the rear surface S2 of the substrate 100 and fill the U-shaped recess **108*r* with the insulating layer 310**.

Figure 13:
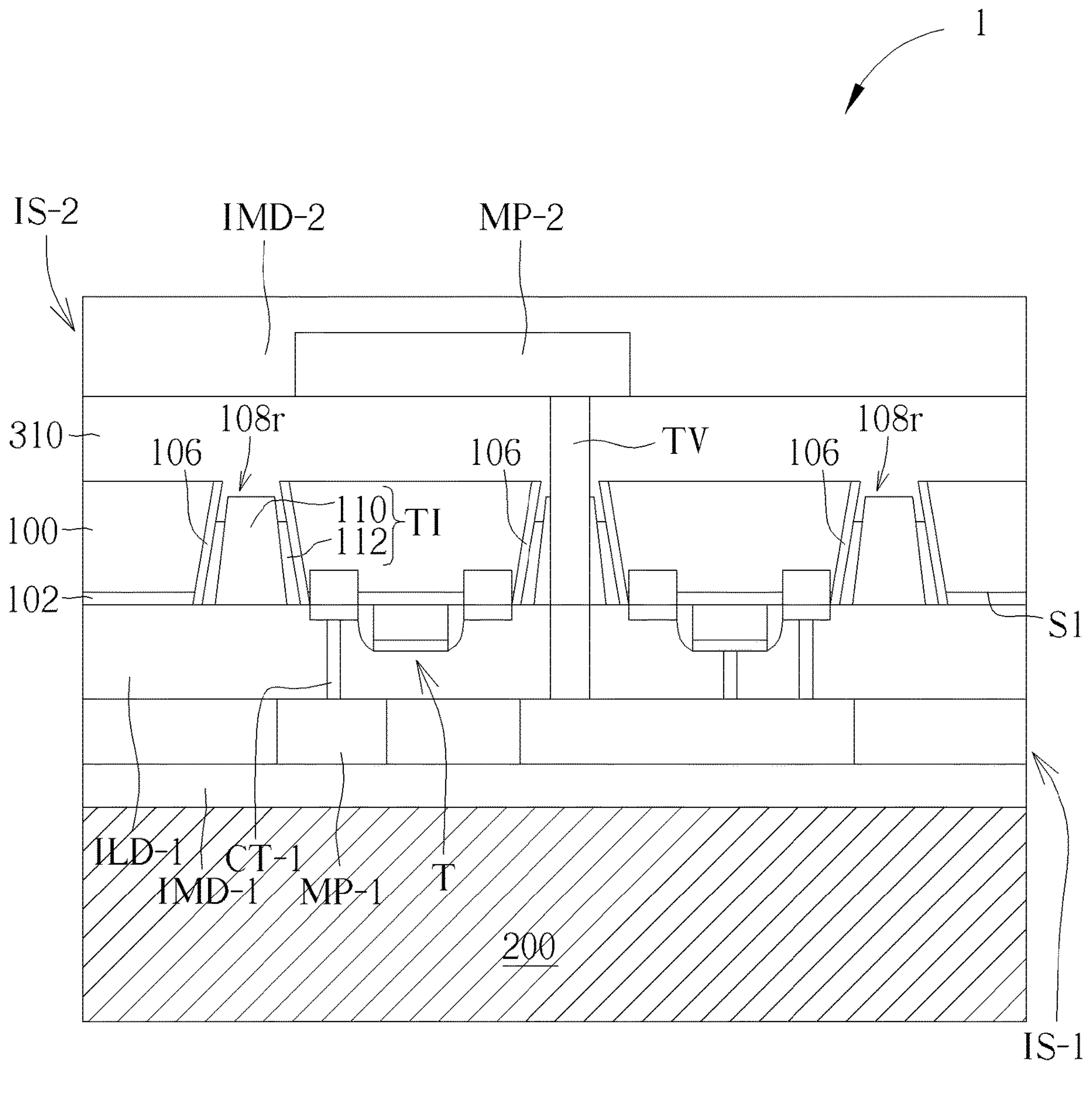

As shown in FIG. 13, next, a second interconnect structure IS-2 is formed on the insulating layer 310. According to an embodiment of the present invention, for example, the second interconnect structure IS-2 may include an interlayer dielectric layer ILD-2, a via TV penetrating the insulating layer 310, the silicon oxide layer 110, and the interlayer dielectric layer ILD-1, an intermetal dielectric layer IMD-2 formed on the interlayer dielectric layer ILD-2, and a metal circuit layer MP-2 formed in the intermetal dielectric layer IMD-2. The via TV can electrically connect the metal circuit layer MP-2 and the metal circuit layer MP-1.

Structurally, as shown in FIG. 13, the semiconductor structure 1 of the present invention includes: a substrate 100 having a front surface S1 and a rear surface S2; a plurality of trenches TR extending from the front surface S1 of the substrate 100 into the substrate 100 and penetrating the substrate 100; the gap-filling material layer 112 is partially filled into the plurality of trenches TR from the front surface S1 of the substrate 100, thereby forming a U-shaped recess **108*r* on the rear surface S2 of the substrate 100; and an insulating layer 310 is filled into the U-shaped groove 108*r* on the rear surface S2 of the substrate 100**.

According to an embodiment of the present invention, the semiconductor structure 1 further includes a circuit element T disposed in the active area AA of the front surface S1 of the substrate 100. According to an embodiment of the present invention, the semiconductor structure 1 further includes a first interconnect structure IS-1 located on the front surface S1 of the substrate 100. According to an embodiment of the present invention, the active areas AA are electrically isolated from one another by the gap-filling material layer 112 and the insulating layer 310.

According to an embodiment of the present invention, the semiconductor structure 1 further includes a second interconnect structure IS-2 located on the insulating layer 310.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor structure, comprising:

providing a substrate having a front surface and a rear surface;

forming a plurality of trenches extending into the substrate from the front surface of the substrate;

forming a polishing stop structure at a bottom of each of the plurality of trenches;

filling the plurality of trenches with a gap-filling material layer;

subjecting the rear surface of the substrate to a polishing process to remove a portion of the substrate from the rear surface until the polishing stop structure is exposed; and after subjecting the rear surface of the substrate to the polishing process, removing the polishing stop structure, thereby forming U-shaped recesses on the rear surface of the substrate.

2. The method of claim 1, wherein the polishing stop structure has a U shaped sectional profile.

3. The method of claim 1, wherein the polishing stop structure comprises a silicon nitride layer.

4. The method of claim 1, wherein the polishing stop structure comprises a carbon doped silicon nitride layer.

5. The method of claim 1, wherein the polishing process comprises a chemical mechanical polishing process.

6. The method of claim 1, wherein before subjecting the rear surface of the substrate to the polishing process, the method further comprises:

forming circuit elements in active areas on the front surface of the substrate; and forming a first interconnect structure on the front surface of the substrate.

7. The method of claim 6, wherein the active areas are electrically isolated from one another by the gap-filling material layer.

8. The method of claim 1 further comprising:

filling U-shaped recesses with an insulating layer.

9. The method of claim 8 further comprising:

forming a second interconnect structure on the insulating layer.

* * * * *